(12) United States Patent
Liu

(10) Patent No.: US 10,333,561 B2
(45) Date of Patent: Jun. 25, 2019

(54) ITERATIVE EQUALIZATION USING NON-LINEAR MODELS IN A SOFT-INPUT SOFT-OUTPUT TRELLIS

(71) Applicant: Northrop Grumman Systems Corporation, Falls Church, VA (US)

(72) Inventor: Daniel N. Liu, Torrance, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 80 days.

(21) Appl. No.: 14/605,377

(22) Filed: Jan. 26, 2015

(65) Prior Publication Data
US 2016/0218752 A1    Jul. 28, 2016

(51) Int. Cl.
*H03M 13/41* (2006.01)
*H03M 13/39* (2006.01)
(Continued)

(52) U.S. Cl.
CPC ... *H03M 13/4169* (2013.01); *H03M 13/3784* (2013.01); *H03M 13/3911* (2013.01);
(Continued)

(58) Field of Classification Search
CPC ............. H03M 13/4169; H03M 13/42; H03M 13/3911
See application file for complete search history.

(56) References Cited

U.S. PATENT DOCUMENTS 5,933,462 A * 8/1999 Viterbi .............. H03M 13/2957
375/262
6,757,865 B1 * 6/2004 Nakamura ........ H03M 13/2957
714/796

(Continued)

FOREIGN PATENT DOCUMENTS

EP          2432180       3/2012
WO       2012032371      3/2012
WO       2014091271      6/2014

OTHER PUBLICATIONS

Design Considerations of Adaptive Trellis-Based Blind Sequence Estimators, Xiao-Ming Chen □ and Peter A. Hoeher, Information and Coding Theory Lab, Faculty of Engineering, 2003.*

(Continued)

*Primary Examiner* — Joseph D Torres
(74) *Attorney, Agent, or Firm* — McCracken & Gillen LLC

(57) ABSTRACT

A method includes: generating a trellis; generating one or more predicted symbols using a first non-linear model; computing and saving two or more branch metrics using a priori log-likelihood ratio (LLR) information, a channel observation, and the one or more predicted symbols; if alpha forward recursion has not yet completed, generating alpha forward recursion state metrics using a second non-linear model; if beta backward recursion has not yet completed, generating beta backward recursion state metrics using a third non-linear model; if sigma forward recursion has not yet completed, generating sigma forward recursion state
(Continued)

metrics using the branch metrics, the alpha state metrics, and the beta backward recursion state metrics; generating extrinsic information comprising a difference of a posteriori LLR information and the a priori LLR information; computing and feeding back the a priori LLR information; and calculating the a posteriori LLR information.

20 Claims, 5 Drawing Sheets

(51) Int. Cl.
    *H03M 13/37*     (2006.01)
    *H04L 25/03*     (2006.01)

(52) U.S. Cl.
    CPC ....... *H03M 13/3927* (2013.01); *H03M 13/42* (2013.01); *H04L 25/03171* (2013.01); *H04L 25/03178* (2013.01)

(56) References Cited

U.S. PATENT DOCUMENTS

| | | | |
|---|---|---|---|
| 7,096,412 | B2 | 8/2006 | Chen et al. |
| 7,254,165 | B2* | 8/2007 | Xie ................. H04L 1/0046 375/219 |
| 7,298,778 | B2 | 11/2007 | Visoz et al. |
| 8,891,701 | B1 | 11/2014 | Eliaz et al. |
| 2004/0001564 | A1* | 1/2004 | Chan ................ H04L 1/005 375/341 |
| 2004/0148556 | A1* | 7/2004 | Hagh ............... H03M 13/2957 714/755 |
| 2004/0196935 | A1 | 10/2004 | Nieto |
| 2007/0092018 | A1* | 4/2007 | Fonseka ........... H04L 1/0054 375/265 |
| 2008/0137779 | A1* | 6/2008 | Valadon ........... H04L 25/03184 375/340 |
| 2009/0132896 | A1* | 5/2009 | Valadon ........... H03M 13/3961 714/792 |
| 2012/0027070 | A1 | 2/2012 | Beidas |
| 2013/0044655 | A1 | 2/2013 | Shaver et al. |
| 2013/0156133 | A1 | 6/2013 | Gentile et al. |

OTHER PUBLICATIONS

Adaptive Diversity Combining, Equalization and Sequence Decoding for Time-Varying Dispersive Channels, A dissertation submitted in partial satisfaction of the requirements for the degree of Doctor of Philosophy in Electrical Engineering, Heung-No Lee, 1999.*
A New SISO Algorithm with Application to Turbo Equalization, Marcin Sikora and Daniel J. Costello, Jr., Department of Electrical Engineering, University of Notre Dame, Dec. 13, 2004.*
Anderson, J.B. et al; Best rate 1/2 convolutional codes for turbo equalization with severe ISI; Information Theory Proceedings (ISIT), 2012 IEEE International Symposium on, pp. 2366-2370; Jul. 1-6, 2012.
Beidas, B.F. et al; Adaptive Volterra compensation for interference of two high-order modulation carriers over satellite; Military Communications Conference, 2009; MILCOM 2009; IEEE, pp. 1-7; Oct. 18-21, 2009.
Chen, M. et al; Multilevel Coding for Nonlinear ISI Channels; Information Theory, 2006 IEEE International Symposium on; p. 615-619; Jul. 9-14, 2006.
Colavolpe, G. et al; Novel SISO Detection Algorithms for Nonlinear Satellite Channels; Global Telecommunications Conference (GLOBECOM 2011), 2011 IEEE, pp. 1-5; Dec. 5-9, 2011.
Fertonani, D. et al; Reduced-Complexity BCJR Algorithm for Turbo Equalization; Communications, IEEE Transactions on, vol. 55, No. 12; pp. 2279-2287; Dec. 2007.
Gunther, J. et al; An interior point method for a semidefinite relaxation based equalizer incorporating prior information; Computational Advances in Multi-Sensor Adaptive Processing (CAMSAP), 2011 4th IEEE International Workshop on, p. 149-152; Dec. 13-16, 2011.
Liu, D. et al; Iterative equalization in non-linear satellite channels; Turbo Codes and Iterative Information Processing (ISTC), 2012 7th International Symposium on, pp. 220-224; Aug. 27-31, 2012.
Loncar, M. et al; A Comparison of Some Trellis- and Tree-Based SISO Algorithms for Decoding and Equalization; Information Theory, 2007; ISIT 2007; IEEE International Symposium on, pp. 1696-1700; Jun. 24-29, 2007.
Prlja, A. et al; Reduced-Complexity Receivers for Strongly Narrowband Intersymbol Interference Introduced by Faster-than-Nyquist Signaling; Communications, IEEE Transactions on, vol. 60, No. 9; pp. 2591-2601; Sep. 2012.
Rusek, F. et al; A rate-maximizing channel-shortening detector with soft feedback side information; Global Communications Conference (GLOBECOM), 2012 IEEE, pp. 2256-2261; Dec. 3-7, 2012.
Sikora, M. et al; A new SISO algorithm with application to turbo equalization; Information Theory, 2005. ISIT 2005. Proceedings. International Symposium on, pp. 2031-2035; Sep. 4-9, 2005.
Zhu, Y. et al; Reduced state BCJR algorithms for one- and two-dimensional equalization; Acoustics, Speech and Signal Processing, 2008. ICASSP 2008. IEEE International Conference on, pp. 3201-3204; Mar. 31, 2008-Apr. 4, 2008.
Perez, A. L. et al; Iterative Detection and Decoding on Nonlinear ISI Channels; Proceedings of IEEE International Conference on Communications; Apr. 28, through May 2, 2002; New York, NY; USA; IEEE; Piscataway, NJ; USA Apr. 28, 2002; pp. 1505-1505; XP001046133, ISBN: 978-0-7803-7400-3.
Abdulkader, H. et al; Neural Networks-Based Turbo Equalization of a Satellite Communication Channel; 2014 IEEE 15th International Workshop on Signal Processing Advances in Wireless Communications (SPAWC), IEEE; Jun. 22, 2014; pp. 494-498; XP032672249; DOI: 10.1109/SPAWC.2014.6941914; [retrieved on Oct. 31, 2014].
Ampeliotis, D. et al; Turbo Equalization of Non-Linear Satellite Channels using Soft Interference Cancellation; Advanced Satellite Mobile Systems, 2008; ASMS 2008, 4th, IEEE, Piscataway, NJ; USA; Aug. 26, 2008; pp. 289-292; XP031393769; ISABN: 978-1-4244-2160-2.
Bahl, L.R. et al; Optimal Decoding of Linear Codes for Minimizing Symbol Error Rate; IEEE Transactions on Information Theory; IEEE Press, USA; Mar. 1, 1974; pp. 284-287; XP002381693; ISSN: 0018-9448.

* cited by examiner

ITERATIVE EQUALIZATION USING NON-LINEAR MODELS IN A SOFT-INPUT SOFT-OUTPUT TRELLIS

STATEMENT OF GOVERNMENT RIGHTS

The Government of the United States of America has rights in this invention pursuant to Government Contract No. 14-C-0077.

SUMMARY

In one set of embodiments, there is provided a method for trellis-based sequence estimation using the algorithm by Bahl, Cocke, Jelinek, and Raviv (BCJR), comprising: generating a trellis; generating one or more predicted symbols using a first non-linear model; computing and saving two or more branch metrics using a priori log-likelihood ratio (LLR) information, a channel observation, and one or more of the one or more predicted symbols; if alpha forward recursion has not yet completed, generating two or more alpha forward recursion state metrics using a second non-linear model; if beta backward recursion has not yet completed, generating two or more beta backward recursion state metrics using a third non-linear model; if sigma forward recursion has not yet completed, generating two or more sigma forward recursion state metrics using the two or more branch metrics, the two or more alpha state metrics, and the two or more beta backward recursion state metrics, in order to estimate a sequence for the trellis; generating extrinsic information comprising a difference of a posteriori LLR information; computing and feeding back the a priori LLR information; and calculating the a posteriori LLR information.

In another set of embodiments, there is provided a method for trellis-based sequence estimation using the algorithm by Bahl, Cocke, Jelinek, and Raviv (BCJR), comprising: generating a trellis; generating one or more predicted symbols using a set of non-linear modeling coefficients corresponding to a first non-linear model; computing and saving two or more branch metrics for a current time increment using a priori log-likelihood ratio (LLR) information for one or more coded bits, a channel observation for the current time increment, and one or more of the one or more predicted symbols; if alpha forward recursion has not yet completed, generating two or more alpha forward recursion state metrics for the current time increment by, using a second non-linear model, applying an add compare select (ACS) algorithm to two or more branch metrics for the current time increment and to two or more alpha forward recursion state metrics for the last previous time increment; if beta backward recursion has not yet completed, generating two or more beta backward recursion state metrics for the current time increment by, using a third non-linear model, applying an ACS algorithm to two or more branch metrics for the current time increment and to two or more beta backward recursion state metrics for the last previous time increment; if sigma forward recursion has not yet completed, generating two or more sigma forward recursion state metrics for the current time increment using the two or more branch metrics for the current time increment, the two or more alpha state metrics for the current time increment, and the two or more beta backward recursion state metrics for the current time increment, in order to estimate a sequence for the trellis; generating extrinsic information comprising a difference of a posteriori LLR information for the one or more coded bits and the a priori LLR information; computing and feeding back the a priori LLR information; and calculating the a posteriori LLR information.

In yet another set of embodiments, there is provided an apparatus for trellis-based sequence estimation, comprising: an amplifier; an equalizer configured to estimate the output of the amplifier by: generating a trellis; generating one or more predicted symbols using a first non-linear model; computing and saving two or more branch metrics using a priori log-likelihood ratio (LLR) information, a channel observation, and one or more of the one or more predicted symbols; if alpha forward recursion has not yet completed, generating two or more alpha forward recursion state metrics using a second non-linear model; if beta backward recursion has not yet completed, generating two or more beta backward recursion state metrics using a third non-linear model; if sigma forward recursion has not yet completed, generating two or more sigma forward recursion state metrics using the two or more branch metrics, the two or more alpha state metrics, and the two or more beta backward recursion state metrics, to estimate a sequence for the trellis; and generating extrinsic information comprising a difference of a posteriori LLR information and the a priori LLR information; and a decoder configured to: compute and to feed back to the equalizer the a priori LLR information; and to calculate the a posteriori LLR information.

DESCRIPTION OF THE DRAWINGS

The accompanying drawings provide visual representations which will be used to more fully describe various representative embodiments and can be used by those skilled in the art to better understand the representative embodiments disclosed herein and their advantages. In these drawings, like reference numerals identify corresponding elements.

DETAILED DESCRIPTION

Figure 1:
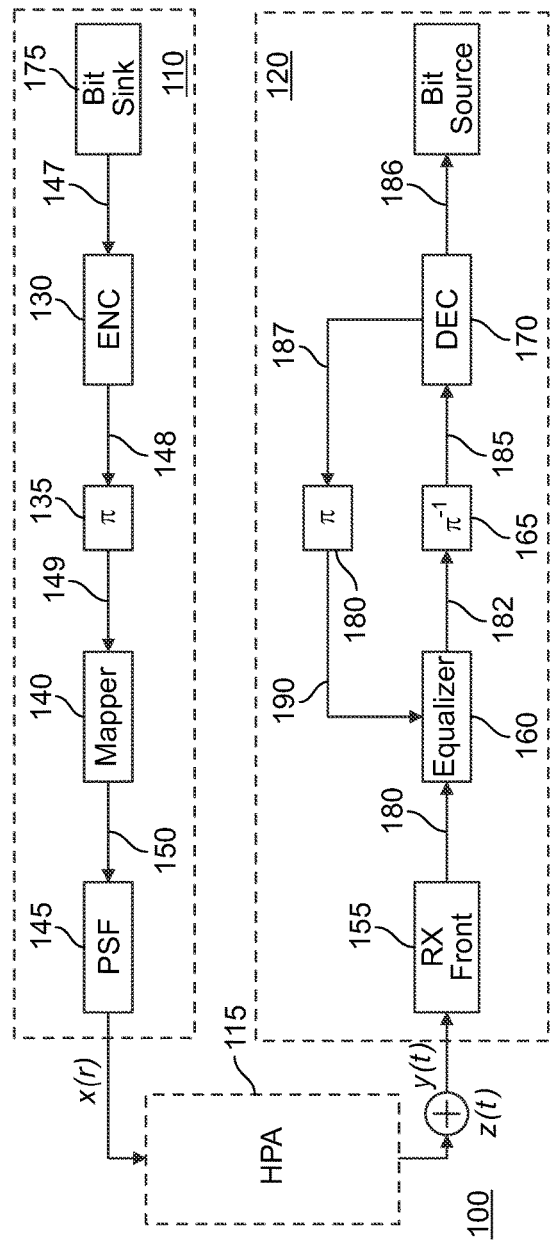
FIG. 1 is a drawing of components of a satellite communication system 100 using advanced iterative equalization via trellis-based SISO computation in a non-linear satellite communication channel.

While the present invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described. In the following description and in the several figures of the drawings, like reference numerals are used to describe the same, similar or corresponding parts in the several views of the drawings.

The invention relates generally to signal equalization and more particularly to equalization of bandwidth-efficient modulation signals in a direct point to point downlink channel broadcasting from a satellite to earth using an iterative equalizer to incorporate non-linear models into computation of trellis branch metrics.

Embodiments of the invention utilize a novel iterative equalizer via an inventive method for incorporating non-linear models into computation of trellis branch metrics.

Embodiments of the invention utilize a novel iterative equalizer via an inventive method for incorporating Volterra series decomposition into trellis branch metric computation. Embodiments of the invention use maximum likelihood sequence estimation (MLSE) with a full complexity trellis structure. Other embodiments of the invention use reduced state sequence estimation (RSSE) with a reduced complexity trellis structure.

There are basically three steps to set up a trellis. First the number of trellis states is determined. Then for each state, the connections are determined between the current state and future states, that is, states in the next time increment. Finally, for each state, the corresponding constellation symbols are determined, for every connection identified in the previous step. In the case of a full complexity trellis structure, there will be one symbol per connection. In the case of a reduced state trellis structure, there will be more than one symbol per connection. Essentially the trellis provides a systematic way to enumerate all possible symbol sequence(s) at any given time instant with respect to the allowed channel memory. This enumeration helps greatly in calculating the branch metric using a priori log-likelihood (LLR) information for one or more coded bits, a channel observation for a current time increment, and one or more of the one or more predicted symbols.

The trellis structure may include one or more of a list of outgoing states for one or more of the current states, a list of incoming states for one or more of the current states, a list of symbols associated with the outgoing states, and a list of symbols associated with the incoming states. Embodiments of the invention utilize a trellis-based iterative equalizer incorporating Volterra series decomposition and operating via a soft-in soft-out (SISO) system using the algorithm by Bahl, Cocke, Jelinek, and Raviv (BCJR) to model and correct non-linear distortions in satellite communications signals. Embodiments of the invention use the four steps of the BCJR algorithm—computation of branch metrics, generation of alpha forward recursion state metrics, generation of beta backward recursion state metrics, and generation of sigma forward recursion state metrics, followed by generation of a posteriori LLR information for one or more coded bits.

Embodiments of the invention employ a small number of dominant terms in a Volterra series analog representation of the digital signal. Embodiments of the invention are directed to an improved iterative equalizer for processing signals in a satellite communication channel that uses bandwidth efficient modulation (BEM) reduced state trellis soft-input soft-output (SISO) equalization to provide near optimal performance.

In alternative embodiments of the invention, other non-linear models can be used instead of Volterra series decomposition in one or more of branch metric computation, alpha forward recursion, beta backward recursion, and sigma forward recursion. Examples of non-linear models that can be used include a memory polynomial model, a Wiener model, a Hammerstein model, a lookup table model, and other non-linear models. Therefore, according to embodiments of the invention, non-linear models that can be used to practice the invention in one or more of branch metric computation, alpha forward recursion, beta backward recursion, and sigma forward recursion include a Volterra series decomposition, a memory polynomial model, a Wiener model, a Hammerstein model, a lookup table model, other non-linear models, and a combination of one or more of these non-linear models.

The memory polynomial model is widely used for behavioral modeling and digital pre-distortion of Power Amplifier (PA)/transmitters exhibiting memory effects. It basically corresponds to a reduction of the Volterra series in which only selective terms are kept. The output waveform of the model is $$x_{out} = \sum_{j=0}^{M} \sum_{i=1}^{N} a_{ji} \cdot x_{in}(n-j) \cdot |x_{in}(n-j)|^{i-1},$$

where N and M are the nonlinearity order and the memory depth of the amplifier, respectively, and $a_{ji}$ are the modeling coefficients.

The Wiener model is a two-box model composed of a linear finite impulse response (FIR) filter followed by a memoryless nonlinear function. The output waveform of this model is given by $$x_{out}(n) = G(|x_1(n)|) \cdot x_1(n),$$

where $G(|x_1(n)|)$ is the memoryless instantaneous gain function implemented in the look-up table model. $x_1(n)$ designates the output of the FIR filter:

$$x_1(n) = \sum_{j=0}^{M} h(j) \cdot x_{in}(n-j),$$

where h(j) are the modeling coefficients of the FIR filter impulse response, and M is the memory depth of the amplifier.

In the Hammerstein model, the static nonlinearity is applied upstream of the linear filter. Thus, the output waveform is given by:

$$x_{out}(n) = \sum_{j=0}^{M} h(j) \cdot x_1(n-j),$$

and $$x_1(n) = G(|x_{in}(n)|) \cdot x_{in}(n),$$

where $x_1(n)$ refers to the output of the first box in the look up table, h(j) is the impulse response of the FIR filter, $G(|x_{in}(n)|)$ is the instantaneous gain of the amplifier using the look-up table model, and M is the memory depth of the amplifier.

In a lookup table (LUT) model or a direct model, the instantaneous gain of the amplifier is a function of the actual input sample $x_{in}(n)$ and the M−1 preceding samples [$x_{in}(n-1)$, $x_{in}(n-2)$, $x_{in}(n-3)$, . . . , $x_{in}(n-M)$] (where M is the memory depth of the amplifier). Hence, the LUT size is $K^{M+1}$, where K is the number of bins required for the memoryless LUT table model. The output waveform is given by $$x_{out}(n)=G(|X_{in}(n)|) \cdot x_{in}(n),$$

where $G(|X_{in}(n)|)$ is the instantaneous complex gain of the amplifier, and $X_{in}(n)$ is the input vector including the present and the M+1 preceding samples. $X_{in}(n)$ is defined as $$X_{in}(n)=[x_{in}(n),x_{in}(n-1),x_{in}(n-2),\ldots,x_{in}(n-M)].$$

For a memory polynomial model, $x_{out} \equiv f_{MP}(x_{in})$, wherein the function $f_{MP}(\bullet)$ denotes the model. Similarly, for a Wiener model, $x_{out} \equiv f_{Wiener}(\bullet)$. For a Hammerstein model, $x_{out} \equiv f_{Hammerstein}(\bullet)$. For an LUT model, $x_{out} \equiv f_{LUT}(\bullet)$. Finally, for a Volterra model, $x_{out} \equiv f_{Volterra}(\bullet)$.

For example, embodiments of the invention may be practiced with branch metric computation, alpha forward recursion, beta backward recursion, and sigma forward recursion all being computed using a Volterra series decomposition. One alternative embodiment of the invention that may be practiced entails computing the branch metric using a memory polynomial model, computing the alpha forward recursion using a Wiener model, computing the backward beta recursion using a Hammerstein model, and computing the sigma forward recursion using a lookup table model.

More generally, embodiments of the invention may be practiced with branch metric computation, alpha forward recursion, beta backward recursion, and sigma forward recursion being calculated using different linear combinations of the available non-linear models, which include a Volterra series decomposition, a memory polynomial model, a Wiener model, a Hammerstein model, a lookup table model, and other non-linear models. For example, the computation of one or more of the branch metric, alpha forward recursion, beta backward recursion, and the sigma forward recursion may be performed using a Volterra series decomposition. For example, the computation of one or more of the branch metric, the alpha forward recursion, the beta backward recursion, and the sigma forward recursion may be performed using a linear combination of a Volterra series decomposition and a lookup table. For example, the computation of one or more of the branch metric, alpha forward recursion, beta backward recursion, and the sigma forward recursion may be performed using different linear combinations of the available non-linear models, which include a Volterra series decomposition, a memory polynomial model, a Wiener model, a Hammerstein model, a lookup table model, and other non-linear models.

Figure 2:
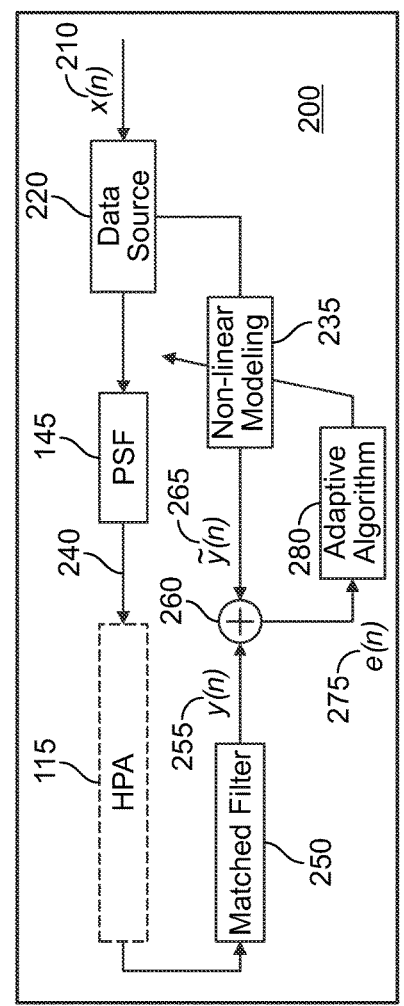
FIG. 2 is a schematic drawing of components of a satellite communication system 100 using advanced iterative equalization via trellis-based SISO computation in a non-linear satellite communication channel, showing details of how to perform system identification and generation of non-linear modeling coefficients.

According to embodiments of the invention, the non-linear model can comprise a linear combination of two non-linear functions. For example, one or more of the computation of the branch metric, the alpha forward recursion metric, and the beta backward recursion metric may be performed using a linear combination of a Volterra series decomposition and a lookup table. For example, If $\lambda_1 + \lambda_2 = 1$, then a non-linear model wherein:

$$x_{out} \equiv f(\bullet) = \lambda_1 \cdot f_{Volterra}(\bullet) + \lambda_2 \cdot f_{LUT}(\bullet),$$

forms a completely valid non-linear modeling of system identification as depicted in FIG. 2.

For example, the computation of one or more of the branch metric, the alpha forward recursion, and the beta backward recursion metric may be performed using different linear combinations of the available non-linear models, which include a Volterra series decomposition, a memory polynomial model, a Wiener model, a Hammerstein model, a lookup table model, and other non-linear models.

Another example is:

$$x_{out} \equiv f(\bullet) = \lambda_1 \cdot f_{Wiener}(\bullet) + \lambda_2 \cdot f_{Hammerstein}(\bullet).$$

One other example would be:

$$x_{out} \equiv f(\bullet) = \lambda_1 \cdot f_{MP}(\bullet) + \lambda_2 \cdot f_{LUT}(\bullet).$$

Any multiple (>2) linear combination of the above non-linear functions can serve as the non-linear model. For example:

If $\Sigma_{i=1}^{N} \lambda_i = 1$, then $$x_{out} \equiv f(\bullet) = \lambda_1 \cdot f_{Volterra}(\bullet) + \lambda_2 f_{Wiener}(\bullet) + \lambda_3 \cdot f_{Hammerstein}(\bullet) + \lambda_4 \cdot f_{LUT}(\bullet).$$

with N=4.

Another example with N=3, could take the form of:

$$x_{out} \equiv f(\bullet) = \lambda_1 \cdot f_{Wiener}(\bullet) + \lambda_2 \cdot f_{Hammerstein}(\bullet) + \lambda_3 \cdot f_{LUT}(\bullet).$$

Any non-linear combination of the above non-linear functions according to Taylor series expansions can serve as the non-linear model. For example:

$$x_{out} \equiv f(\cdot) \equiv \sum_{n=0}^{\infty} \frac{f_{Volterra}^{(n)}(a)}{n!}(x-a)^n,$$

where $f^{(n)}$ denotes $n^{th}$ derivative of function $f$. Another example would be:

$$x_{out} \equiv f(\cdot) \equiv \sum_{n=0}^{\infty} \frac{f_{MP}^{(n)}(a)}{n!}(x-a)^n.$$

One of the key concepts behind embodiments of the invention is the realization that the result of system identification is dependent on the individual device. Also, straightforward realization of the above non-linear functions could result in intractable complexity of the model. According to embodiments of the invention, the most significant terms from the modeling may be selected and used as non-linear" modeling coefficients in trellis computation.

Criteria used in selecting the most significant terms include: the minimum mean squared error (MSE) and the minimum MSE of a Taylor series expansion.

The received signal is corrupted by HPA non-linearity and also by additive white Gaussian noise (AWGN). The baseband equivalent y(t) of the transmitted signal x(t) has the form y(t)=x(t)*h(t)+n(t), where h(t) is the channel and n(t) is the noise. In the case where Volterra series decomposition is the non-linear model, the signal y(t) can then be approximated as a function of x(t) using a Volterra-series decomposition in which only odd-order terms appear. Phase distortions may be introduced by the non-linearity of the device.

The trellis-based iterative equalizer models and corrects non-linear distortions in satellite communications signals. Preferably, the equalizer operates via a reduced state SISO system using the BCJR algorithm to model and correct non-linear distortions in satellite communications signals. Preferably, the trellis-based iterative equalizer incorporates non-linear model and operates via a reduced state SISO system using the BCJR algorithm to model and correct non-linear distortions in satellite communications signals. For example, the trellis-based iterative equalizer incorporates Volterra series decomposition and operates via a reduced state SISO system using the BCJR algorithm to model and correct non-linear distortions in satellite communications signals.

The equalizer generates a full complexity trellis structure. Alternatively, or additionally, the equalizer generates a reduced complexity trellis structure. The trellis-based equalizer may comprise one or more of a list of outgoing states for one or more of the current states, a list of incoming states for one or more of the current states, a list of symbols associated with the outgoing states, and a list of symbols associated with the incoming states.

The equalizer computes one or more branch metrics for the current time increment, incorporating one or more non-linear channel contributions into one or more parallel branch metrics via a non-linear model.

For example, the log likelihood ratio is obtained for each coded bit and fed back by the decoder to the equalizer.

According to embodiments of the invention using Volterra series decomposition, the branch metric for the current time increment is calculated using the following equation:

$$y(n) = \sum_{n_1=0}^{N-1} h_{n_1}^{(1)} x(n-n_1) + \sum_{n_1=0}^{N-1} \sum_{n_2=0}^{N-1} \sum_{n_3=0}^{N-1} h_{n_1 n_2 n_3}^{(3)} x(n-n_1) x(n-n_2) x(n-n_3)^{\dagger} + \sum_{n_1=0}^{N-1} \sum_{n_2=0}^{N-1} \sum_{n_3=0}^{N-1} \sum_{n_4=0}^{N-1} \sum_{n_5=0}^{N-1} h_{n_1 n_2 n_3 n_4 n_5}^{(5)} x(n-n_1) x(n-n_2) x(n-n_3) x(n-n_4)^{\dagger} x(n-n_5)^{\dagger} + \ldots + z(n) \tag{1}$$

wherein $y(n)$ is the symbol observation at the nth symbol time; N is the underlying channel memory length; $h_{n_1}^{(1)}$ are first order Volterra series modeling coefficients (also referred to as first order kernel coefficients) for the linear response of the satellite channel; $h_{n_1 n_2 n_3}^{(3)}$ are third order Volterra series modeling coefficients ($3^{rd}$ order, again also refer to as third order kernel coefficients) for the non-linear response of the satellite channel; $x(n-n_i)$ is the information symbol transmitted at the $(n-n_i)$th symbol time; and $z(n)$ is additive white Gaussian noise (AWGN).

FIG. 1 is a drawing of components of a satellite communication system 100 using advanced iterative equalization via trellis-based SISO in a non-linear satellite communication channel. The communication system 100 comprises a transmitter system 110, a high power amplifier (HPA) 115, and a receiver system 120. The transmitter system 110 generates the outgoing signal x(t) and comprises a bit source 125, an encoder 130, a transmitter-side bit interleaver 135, a mapper 140, and a pulse shaping filter (PSF) 145. The bit source 125 produces an information bit b 147 that is sent to the encoder 130. The encoder 130 may be, for example, a forward error correction (FEC) encoder 130. The encoder 130 encodes the information bit 147, producing a coded information bit c 148 that is sent to the transmitter-side bit interleaver 135. The transmitter-side bit interleaver 135 receives the coded information bit 148, producing a transmitter-side interleaved bit 149 that is sent to the mapper 140. The mapper 140 maps the transmitter-side interleaved bit 149 into a symbol in the Cartesian coordinate system comprising real and imaginary axes, thereby generating a modulated output symbol sequence 150 that is sent to the PSF 145. PSF's 145 are generally utilized by communication systems to provide one or more spectral masks in order that signals are well behaved and in order to limit one or more signals to their respective allotted spectra with substantially no spillover into neighboring spectral bands. PSF's 145 provide spectral containment.

The PSF 145 is configured to operate in a very crowded spectrum, assigning the functions of interest their own individual spectral band in the frequency domain. The PSF 145 preferably assigns to a function of interest a bandwidth and a carrier frequency $f_c$. For example, the PSF 145 may assign to a frequency of interest the bandwidth extending from approximately 995 MHz to 1.05 GHz, with a frequency center point $f_c$=1.00 GHz. The PSF 145 generates the outgoing analog time-domain signal x(t).

For example, the HPA 115 may be a traveling-wave tube amplifier (TWTA). For example, the HPA 115 may be a solid-state power amplifiers (SSPA). An HPA 115 is a very non-linear device unless one operates at power back-off mode, which reduces efficiency. The HPA may comprise one or more of a pre-amplifier filter, a memoryless nonlinear amplifier, and a post-amplifier filter.

The purpose of the receiver system 120 is to recover the coded information bits 148, which are corrupted by channel distortion, carrier frequency offset (CFO) and additive noise. The receiver system 120 receives the received signal y(t) and comprises a receiver front-end processing block 155, an equalizer 160, an inverse bit interleaver 165, a decoder 170, a bit sink 175, and a receiver-side bit interleaver 180. The receiver front-end processing block 155 receives the received signal y(t) and tracks and estimates a carrier frequency offset (CFO). The CFO is the rate of change of the phase offset $\theta_0$. In order to produce all the sufficient statistics needed to demodulate the signals prior to the equalizer 160, the receiver front-end processing block 155 is configured to perform one of more of the following algorithms: automatic gain control (AGC), analog to digital conversion (ADC), timing recovery (TR) and down sampling (DS). These functions help ensure that the received signal is optimally synchronized and down sampled.

The equalizer 160 takes into account non-linearity and recovers transmitted information in a computational efficient way. The key insight underlying embodiments of the current invention is that only a few symbols cause significant interference to the current symbol of interest due to limited channel memory, which allows the optimal trellis description complexity of the underlying non linear channel to remain small and hence allows the equalization complexity to remain small. The trellis-based iterative equalizer 160 may comprise one or more of a processor, equalizer memory, and equalizer data storage. Preferably, the equalizer memory comprises one or more of an alpha data memory section, a beta data memory section, and a sigma data memory section. Preferably, the equalizer memory comprises one or more of an alpha data memory section, a beta data memory section, and a sigma data memory section.

Sampling of the received analog signal y(t) is carried out in the analog domain using a small sampling interval $T_s$ and a corresponding sampling frequency $1/T_s$. For example, a representative sampling frequency $1/T_s$ is approximately 20 Ghz, which corresponds to a sampling interval of approximately 0.05 nanoseconds.

The receiver front-end processing block thereby generates from the received analog signal y(t) a processed signal 180. The processed signal 180 may comprise a sequence of samples. The processed signal 180 is an approximate mathematical description of how y(t) is generated from x(t) through channel convolution h(t) and noise generation n(t).

The processed signal 180 is transmitted to the equalizer 160. The equalizer 160 receives the processed signal 180 and equalizes the processed signal 180 by undoing the channel distortion according to embodiments of the invention, transmitting to the inverse bit interleaver 165 an equalizer output 182. The equalizer output 182 comprises extrinsic information comprising a difference of a posteriori log-likelihood ratio (LLR) information for the one or more coded information bits and the a priori LLR information.

The inverse bit interleaver 165 receives the equalizer output 182 and generates inverse bit interleaver output 185. Inverse bit interleaver output 185 represents the best available estimate of the information bit 147 given the signal-to-noise ratio (SNR).

The inverse bit interleaver output 185 is received by the decoder 170, which decodes the inverse bit interleaver output 185, generating decoder output 186 comprising the a posteriori LLR information. The decoder 170 also generates decoder feedback 187 comprising the a priori LLR information. For example, in the case of minimal distortion, a representative process might require on the order of ten iterations. For example, in the case of more or less typical distortion, a representative process might require on the order of one hundred iterations. For example, in the case of substantial distortion, a representative process might require on the order of a thousand iterations.

The receiver-side bit interleaver 180 receives the decoder feedback 187, generating a receiver-side interleaved bit 190. The receiver-side interleaved bit 190 is fed back into the equalizer 160. Furthermore, h(t) denotes the non-linear distortional channel impulse response. The decoder 170 also calculates and outputs to the bit sink 175 the a posteriori LLR information.

FIG. 2 is a schematic drawing of a scheme 200 for identification of a non-linear system in the context of components of a satellite communication system using advanced iterative equalization via trellis-based SISO computation in a non-linear satellite communication channel.

A digital information sequence x(n) 210 is transmitted to a data source 220. From the data source, the digital information sequence x(n) 210 is transmitted to a pulse shaping filter 145 and also to non-linear modeling 235. The pulse shaping filter 145 then generates PSF output 240.

The digital information sequence is then output as PSF 240 from the PSF 145 as an analog domain waveform corresponding to the transmitted signal. The analog domain waveform next passes through the non-linear HPA 115.

After exiting the non-linear HPA 115, the analog domain waveform next is fed into a matched filter 250. The matched filter 250 generates a reference received signal y(n) 255 in the digital domain, which is then transmitted to junction 260. A non-linearly modeled received signal ŷ(n) 265 is generated via non-linear modeling 270 and is transmitted to junction 260. The PSF 145 is configured so that the reference received signal y(n) 255 is generated that is very similar counterpart generates by non-linear modeling ŷ(n) 265.

At junction 260, the reference received signal y(n) 255 is compared to its counterpart generated by non-linear modeling, ŷ(n) 265. The difference between the two derived from this comparison is defined as the modeling error e(n) 275, which is expressed by the equation: e(n)=y(n)−ŷ(n). The modeling error e(n) 275 is then transmitted to an adaptive algorithm 280 capable of adapting the non-linear modeling 265 by tweaking the non-linear modeling coefficients to reduce the generated modeling error e(n) 275.

According to embodiments of the invention, adaptive looping is used to minimize the modeling error e(n) so that the non-linear model uses the best possible non-linear modeling coefficients. Accordingly, when an input waveform x(n) 210 is provided, a reference received signal y(n) 255 is generated that is very similar counterpart generates by non-linear modeling ŷ(n) 265.

FIG. 3A-3D are representative plots for four different modulation systems of bit error rate (BER) vs. the ratio of energy per bit to noise power spectral density, $E_b/N_0$, measured in decibels, showing the excellent performance of embodiments of the invention as applied to four different types of constellations in the presence of one or more non-linear channels.

Figure 3A:
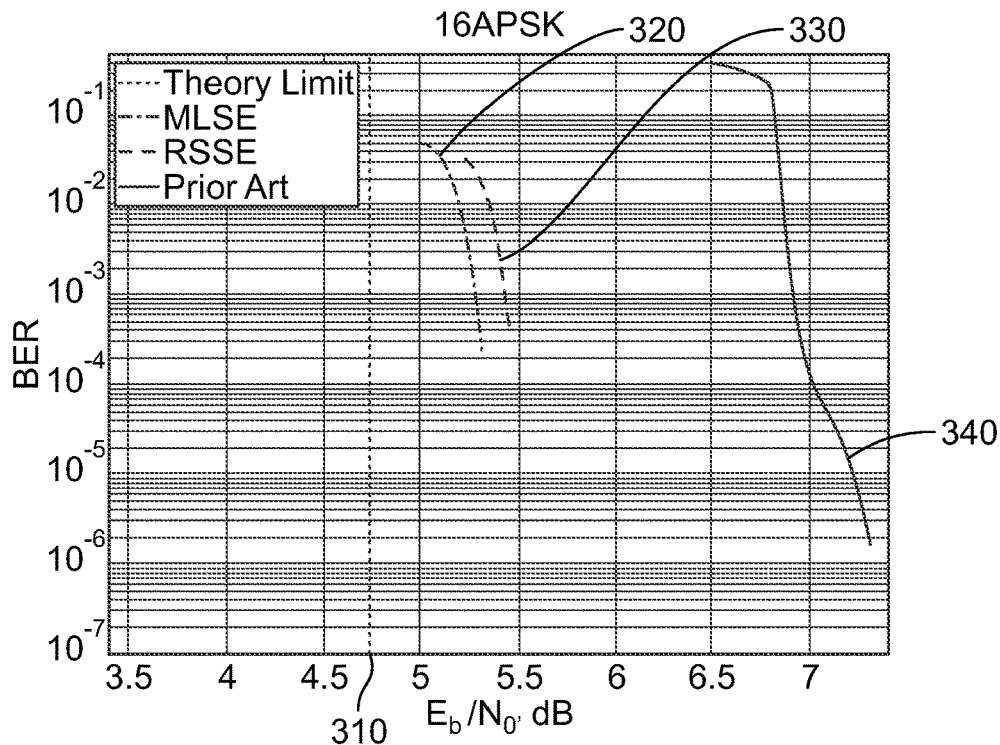
FIGS. 3A-3D are representative plots for four different modulation systems of bit error rate (BER) vs. the ratio of energy per bit to noise power spectral density, $E_b/N_0$, showing the excellent performance of embodiments of the invention.

FIG. 3A shows a 16 Ary Amplitude and Phase Shift Keying (16APSK) constellation in the presence of a non-linear channel. The dotted line 310 is the theoretical best possible result. The cross-hatched line 320 is the result achieved by embodiments of the invention for MLSE. The dashed line 330 is the result achieved by reduced state sequence estimation RSSE. The solid line 340 is the prior art result, which is clearly inferior.

Figure 3B:
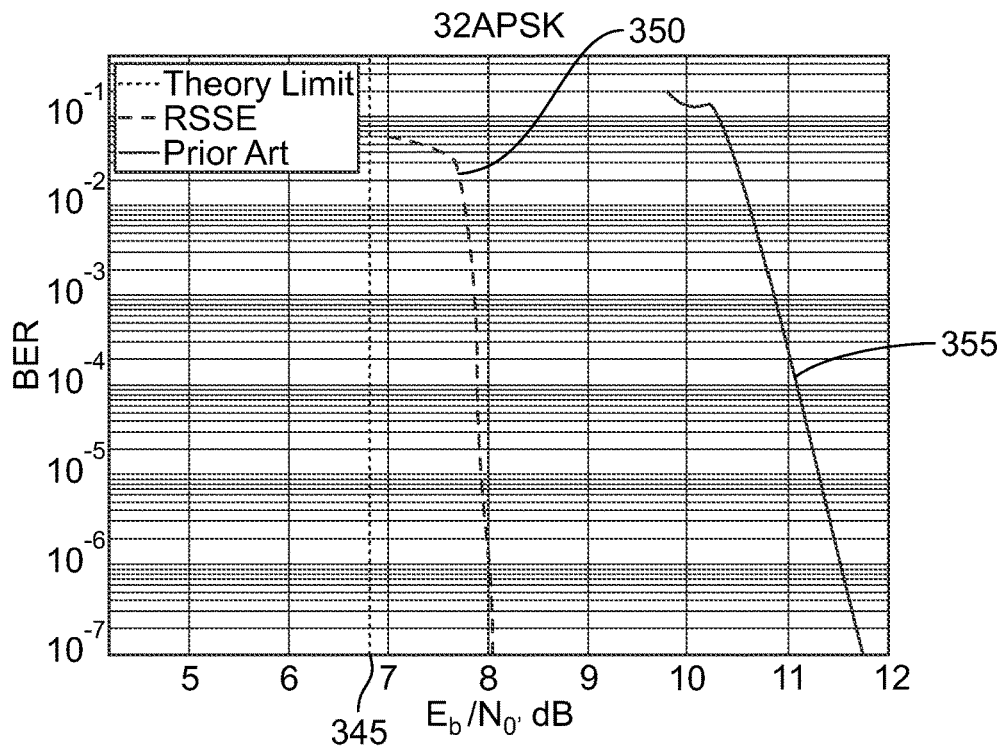

FIG. 3B shows a 32-Ary Amplitude and Phase Shift Keying (32APSK) constellation in the presence of a non-linear channel. The dotted line 345 is the theoretical best possible result. The dashed line 350 is the result achieved by embodiments of the invention for RSSE. The solid line 355 is the prior art result, which is clearly inferior.

Figure 3C:
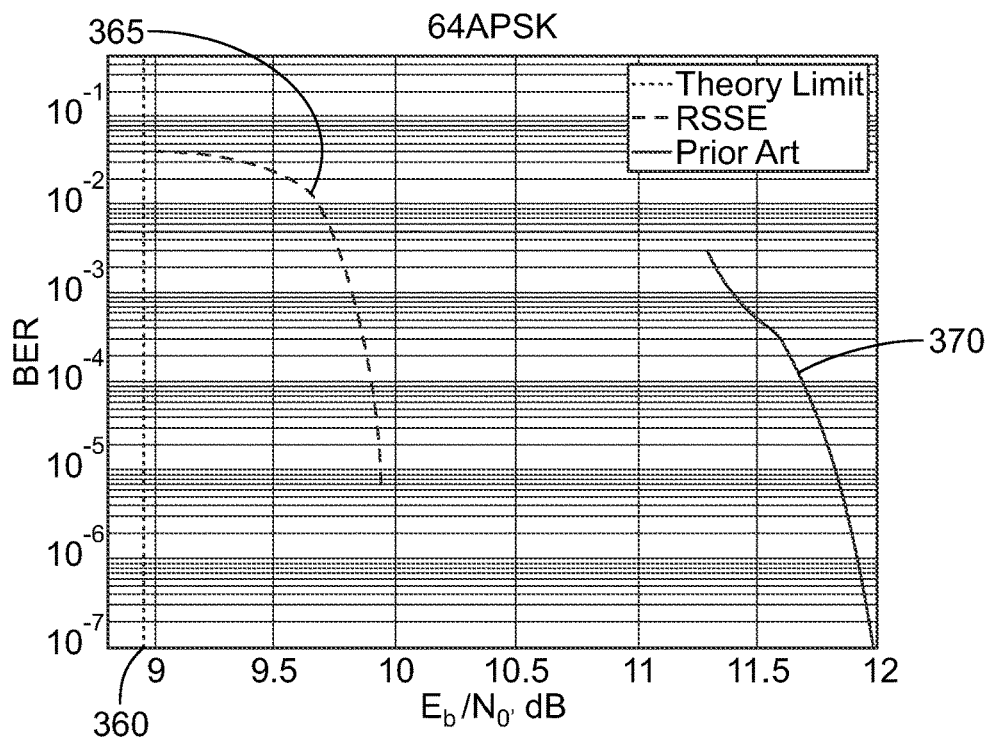

FIG. 3C shows a 64-Ary Amplitude and Phase Shift Keying (64APSK) constellation in the presence of a non-linear channel. The dotted line 360 is the theoretical best possible result. The dashed line 365 is the result achieved by embodiments of the invention for RSSE. The solid line 370 is the prior art result, which is clearly inferior.

Figure 3D:
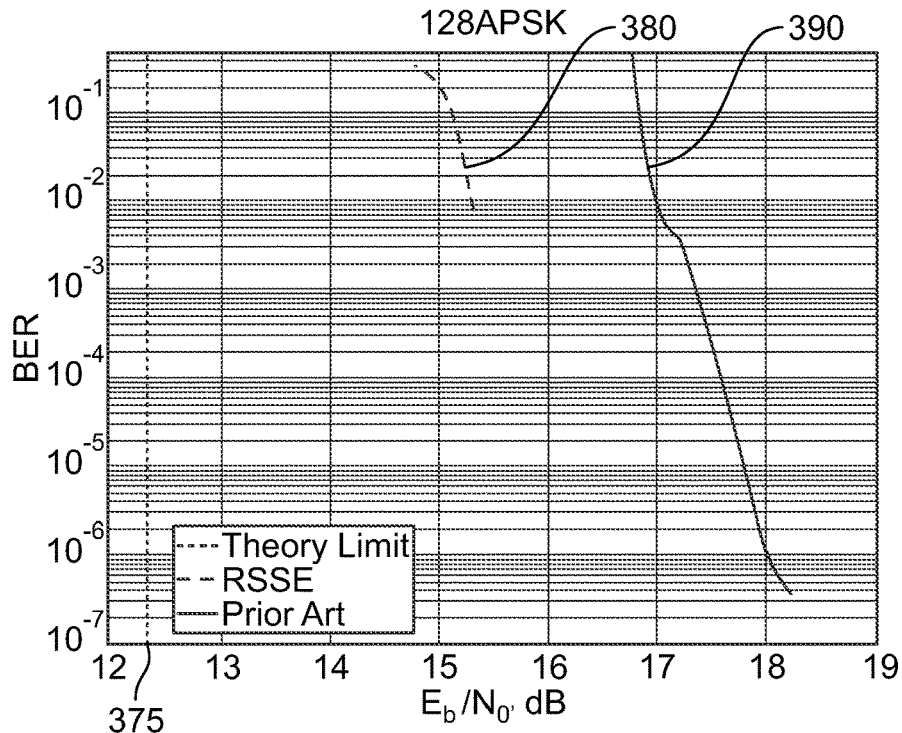

FIG. 3D shows a 128-Ary Amplitude and Phase Shift Keying (128APSK) constellation in the presence of a non-linear channel. The dotted line 375 is the theoretical best possible result. The dashed line 380 is the result achieved by embodiments of the invention for RSSE. The solid line 390 is the prior art result, which is clearly inferior.

Figure 4:
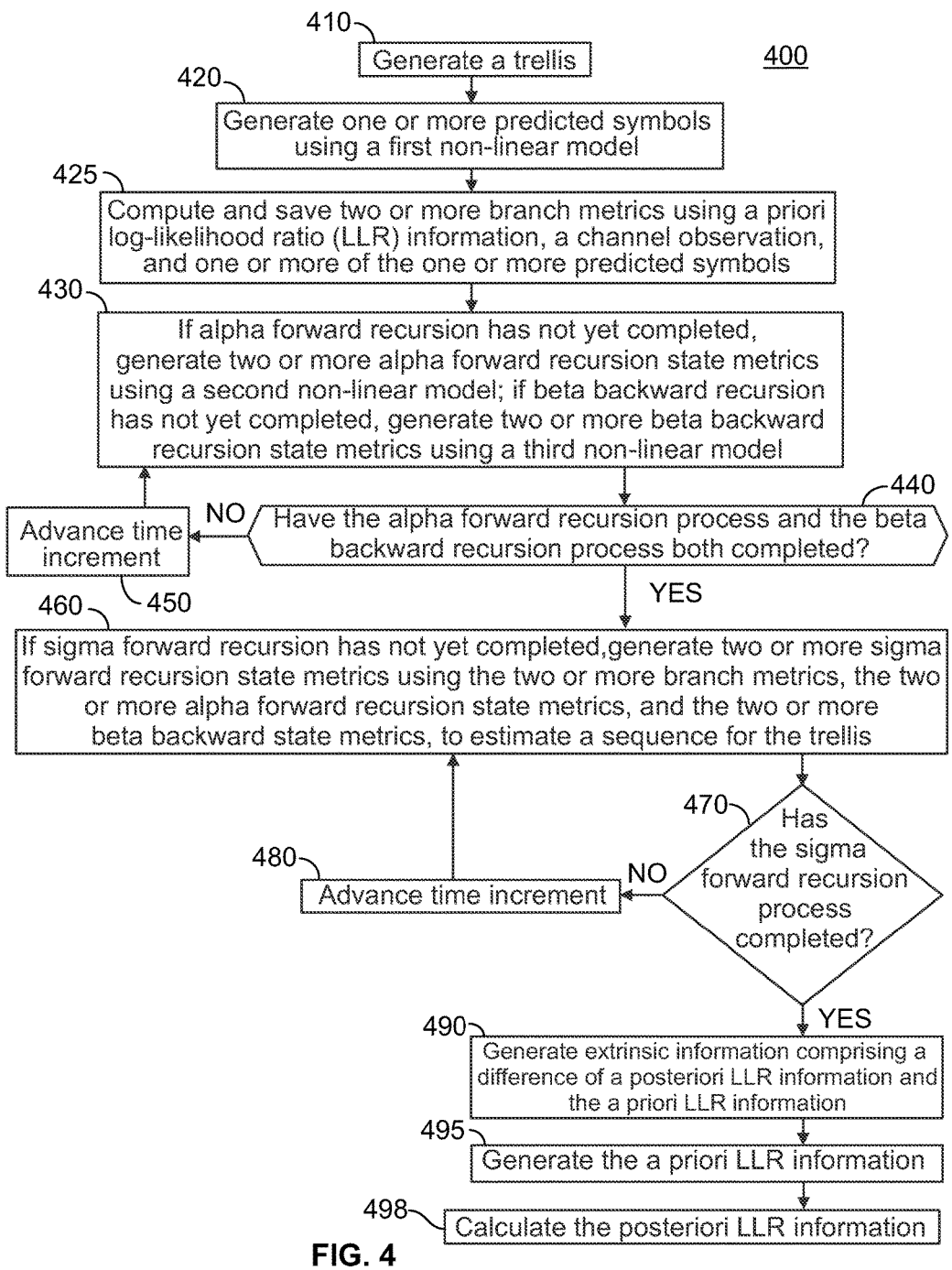
FIG. 4 is a flowchart of a method for trellis-based sequence estimation using a SISO equalizer according to embodiments of the invention.

FIG. 4 is a flowchart of a method 400 for trellis-based sequence estimation using a SISO equalizer according to embodiments of the invention. The order of the steps in the method 400 is not constrained to that shown in FIG. 4 or described in the following discussion. Several of the steps could occur in a different order without affecting the final result.

In step 410, a trellis structure is generated. The trellis structure may be an MLSE full complexity trellis structure. Alternatively, the trellis structure may be a RSSE trellis structure.

The trellis structure may include one or more of a list of outgoing states for one or more of the current states, a list of incoming states for one or more of the current states, a list of symbols associated with the outgoing states, and a list of symbols associated with the incoming states. Block 410 then transfers control to block 420.

In step 420, one or more predicted symbols are generated by an equalizer using a first non-linear model. Typically although not necessarily, the equalizer is a soft-input, soft-output equalizer. Block 420 then transfers control to block 425.

In step 425, two or more branch metrics are computed by the equalizer using a priori log-likelihood (LLR) information comprising a priori probabilities, a channel observation, and one or more of the one or more predicted symbols. When the system is initialized, if no branch metrics were calculated for the last previous time increment, the initial value is set to zero. Alternatively, the initial value of the branch metric may be determined via another initialization method.

The two or more branch metrics are then saved by the equalizer in one or more of equalizer memory and equalizer data storage. Alternatively, the two or more branch metrics may be computed in advance for multiple time increments and then saved in one or more of equalizer memory and equalizer data storage. Such computation on the fly has the advantage of saving on computational memory.

For example, the computation of the two or more branch metrics may be performed using as the first non-linear model a Volterra series decomposition using the Volterra equation (1). For example, the computation of the two or more branch metrics may be performed using as the first non-linear model a linear combination of a Volterra series decomposition and a lookup table. For example, the computation of the two or more branch metrics may be performed using as the first non-linear model different linear combinations of the available non-linear models, which include a Volterra series decomposition, a memory polynomial model, a Wiener model, a Hammerstein model, a lookup table model, and other non-linear models. Block 425 then transfers control to block 430.

In step 430, if alpha forward recursion has not yet completed, two or more alpha forward recursion state metrics are generated by the equalizer for the current time increment using a second non-linear model. If the beta backward recursion process has not yet completed, two or more beta backward recursion state metrics are generated by the equalizer for the current time increment using a third non-linear model.

When the system is initialized, if no alpha forward recursion state metric was calculated for a last previous time increment, the initial value is set to zero. When the system is initialized, if no beta backward recursion state metric was calculated for the last previous time increment, the initial value is set to zero. Alternatively, the initial value of the beta backward recursion state metric may be determined via another initialization method. Alternatively, the initial value of the alpha forward recursion state metric may be determined via another initialization method.

For example, the computation of the two or more alpha forward recursion state metrics may be performed using a Volterra series decomposition using the Volterra equation (1). For example, the computation of the two or more beta backward recursion state metrics may be performed using a Volterra series decomposition using the Volterra equation (1). For example, the computation of the two or more alpha forward recursion state metrics may be performed using a linear combination of a Volterra series decomposition and a lookup table. For example, the computation of the two or more beta backward recursion state metrics may be performed using a linear combination of a Volterra series decomposition and a lookup table. For example, the computation of the two or more alpha forward recursion state metrics may be performed using different linear combinations of the available non-linear models, which include a Volterra series decomposition, a memory polynomial model, a Wiener model, a Hammerstein model, a lookup table model, and other non-linear models. For example, the computation of the two or more beta backward recursion state metrics may be performed using different linear combinations of the available non-linear models, which include a Volterra series decomposition, a memory polynomial model, a Wiener model, a Hammerstein model, a lookup table model, and other non-linear models. Block 430 then transfers control to block 440.

In step 440, it is queried by the equalizer whether alpha forward recursion and beta backward recursion have both completed. If no, the process loops to step 450, in which the time increment is advanced, and then continues back to step 430. If yes, the process continues to step 460.

In step 460, if sigma forward recursion has not yet completed, two or more sigma forward recursion state metrics are generated by the equalizer for the current time increment using the two or more branch metrics for the current time increment, the two or more alpha forward recursion state metrics for the current time increment, and the two or more beta backward recursion state metrics for the current time increment, to estimate a sequence for the trellis.

For example, the sigma forward recursion state metrics may be generated by adding the two or more branch metrics for the current time increment, the two or more alpha forward recursion state metrics for the current time increment, and the two or more beta backward recursion state metrics for the current time increment. For example, the sigma forward recursion state metrics may be generated by adding, as the contribution from the two or more branch metrics, the two or more branch metrics for the current time increment for some rather than all of the connections. As another example, the sigma forward recursion state metrics may be generated by adding, as the contribution from the two or more alpha forward recursion state metrics, the two or more alpha forward recursion state metrics for the current time increment for some rather than all of the connections. As yet another example, the sigma forward recursion state metrics may be generated by adding, as the contribution from the two or more beta recursion state metrics, the two or more beta recursion state metrics for the current time increment for some rather than all of the connections. Block 460 transfers control to block 470.

In step 470, it is queried by the equalizer whether sigma forward recursion has completed. For example, in the case of minimal distortion, a representative process might require on the order of ten iterations. For example, in the case of more or less typical distortion, a representative process might require on the order of one hundred iterations. For example, in the case of substantial distortion, a representative process might require on the order of a thousand iterations. If no, the process loops back to step 480, in which the time increment is advanced, and then continues back to step 460. If yes, the process continues to step 490.

In step 490, the equalizer computes and outputs to a decoder soft extrinsic information comprising a difference of a posteriori log-likelihood ratio (LLR) information and the a priori LLR information. A symbol branch corresponds to one symbol in the case of MLSE and a symbol branch corresponding to more than one symbol in the case of RSSE. Block 490 then transfers control to block 495.

In step 495, the decoder computes and feeds back to the equalizer the a priori LLR information for the one or more coded bits. Block 495 then transfers control to block 498.

In step 498, the decoder computes the a posteriori LLR information and outputs it to a bit sink.

Block 498 then terminates the process.

Figure 5:
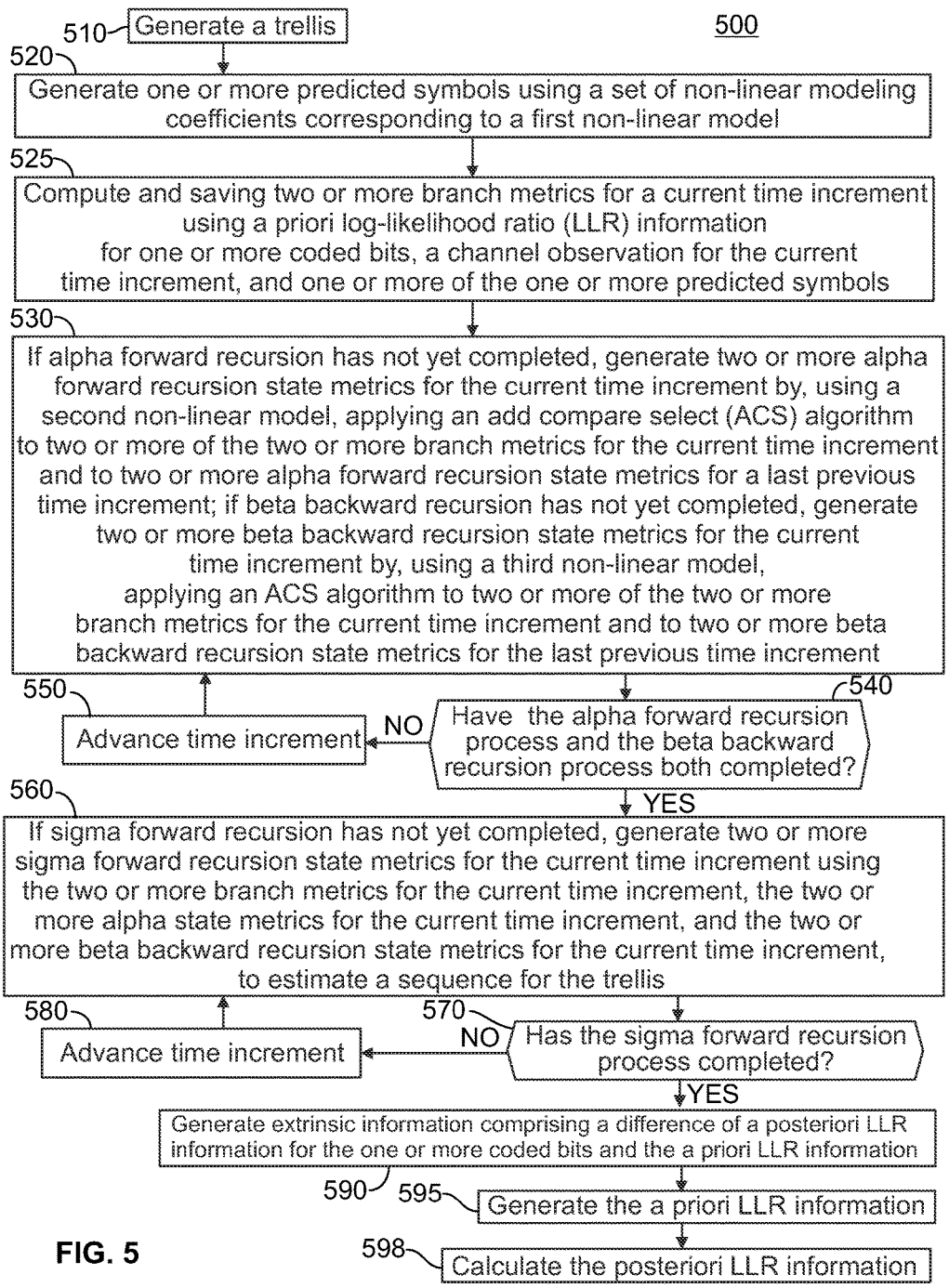
FIG. 5 is a flowchart of a more detailed method for trellis-based sequence estimation using a SISO equalizer according to embodiments of the invention.

FIG. 5 is a flowchart of a more detailed method 500 for trellis-based sequence estimation using a SISO equalizer according to embodiments of the invention. The order of the steps in the method 500 is not constrained to that shown in FIG. 5 or described in the following discussion. Several of the steps could occur in a different order without affecting the final result.

In step 510, a trellis structure is generated. The trellis structure may be an MLSE full complexity trellis structure. Alternatively, the trellis structure may be a RSSE trellis structure.

As above, the trellis structure may include one or more of a list of outgoing states for one or more of the current states, a list of incoming states for one or more of the current states, a list of symbols associated with the outgoing states, and a list of symbols associated with the incoming states. Block 510 then transfers control to block 520.

In step 520, one or more predicted symbols are generated by an equalizer using a set of non-linear modeling coefficients corresponding to a first non-linear model. Typically although not necessarily, the equalizer is a soft-input, soft-output equalizer. Block 520 then transfers control to block 525.

In step 525, two or more branch metrics are computed by the equalizer using a priori log-likelihood (LLR) information for one or more coded bits, a channel observation, and one or more of the one or more predicted symbols. When the system is initialized, if no branch metrics were calculated for a last previous time increment, the initial value is set to zero. Alternatively, the initial value of the branch metric may be determined via another initialization method.

The two or more branch metrics are then saved in one or more of equalizer memory and equalizer data storage. Alternatively, the two or more branch metrics may be computed in advance for multiple time increments and then saved in one or more of equalizer memory and equalizer data storage. Such computation on the fly has the advantage of saving on computational memory.

For example, the computation of the two or more branch metrics may be performed using as the first non-linear model a Volterra series decomposition using the Volterra equation (1). For example, the computation of the two or more branch metrics may be performed using as the first non-linear model a linear combination of a Volterra series decomposition and a lookup table. For example, the computation of the two or more branch metrics may be performed using as the first non-linear model different linear combinations of the available non-linear models, which include a Volterra series decomposition, a memory polynomial model, a Wiener model, a Hammerstein model, a lookup table model, and other non-linear models. Block 525 then transfers control to block 530.

In step 530, if alpha forward recursion has not yet completed, two or more alpha forward recursion state metrics are generated by the equalizer for the current time increment by, using a second non-linear model, applying an add compare select (ACS) algorithm to two or more branch metrics for the current time increment and to two or more alpha forward recursion state metrics for the last previous time increment. If beta backward recursion has not yet completed, two or more beta backward recursion state metrics are generated for the current time increment by, using a third non-linear model, applying an ACS algorithm to two or more branch metrics for the current time increment and to two or more beta backward recursion state metrics for the last previous time increment.

When the system is initialized, if no alpha forward recursion state metric was calculated for the last time increment, the initial value is set to zero. When the system is initialized, if no beta backward recursion state metric was calculated for the last time increment, the initial value is set to zero. Alternatively, the initial value of the beta backward recursion state metric may be determined via another initialization method. Alternatively, the initial value of the alpha forward recursion state metric may be determined via another initialization method.

For example, the computation of the two or more alpha forward recursion state metrics may be performed using a Volterra series decomposition using the Volterra equation (1). For example, the computation of the two or more beta backward recursion state metrics may be performed using a Volterra series decomposition using the Volterra equation (1). For example, the computation of the two or more alpha forward recursion state metrics may be performed using a linear combination of a Volterra series decomposition and a lookup table. For example, the computation of the two or more beta backward recursion state metrics may be performed using a linear combination of a Volterra series decomposition and a lookup table. For example, the computation of the two or more alpha forward recursion state metrics may be performed using different linear combinations of the available non-linear models, which include a Volterra series decomposition, a memory polynomial model, a Wiener model, a Hammerstein model, a lookup table model, and other non-linear models. For example, the computation of the two or more beta backward recursion state metrics may be performed using different linear combinations of the available non-linear models, which include a Volterra series decomposition, a memory polynomial model, a Wiener model, a Hammerstein model, a lookup table model, and other non-linear models. Block 530 then transfers control to block 540.

In step 540, it is queried by the equalizer whether alpha forward recursion and beta backward recursion have both completed. If no, the process loops to step 550, in which the time increment is advanced, and then continues back to step 530. If yes, the process continues to step 560.

In step 560, if sigma forward recursion has not yet completed, two or more sigma forward recursion state metrics are generated by the equalizer for the current time increment using the two or more branch metrics for the current time increment, the two or more alpha forward recursion state metrics for the current time increment, and the two or more beta backward recursion state metrics for the current time increment, to estimate a sequence for the trellis.

For example, the sigma forward recursion state metrics may be generated by adding the two or more branch metrics for the current time increment, the two or more alpha forward recursion state metrics for the current time increment, and the two or more beta backward recursion state metrics for the current time increment. For example, the sigma forward recursion state metrics may be generated by adding, as the contribution from the two or more branch metrics, the two or more branch metrics for the current time increment for some rather than all of the connections. As another example, the sigma forward recursion state metrics may be generated by adding, as the contribution from the two or more alpha forward recursion state metrics, the two or more alpha forward recursion state metrics for the current time increment for some rather than all of the connections. As yet another example, the sigma forward recursion state metrics may be generated by adding, as the contribution from the two or more beta recursion state metrics, the two or more beta recursion state metrics for the current time increment for some rather than all of the connections. Block 560 transfers control to block 570.

In step 570, it is queried by the equalizer whether sigma forward recursion has completed. For example, in the case of minimal distortion, a representative process might require on the order of ten iterations. For example, in the case of more or less typical distortion, a representative process might require on the order of one hundred iterations. For example, in the case of substantial distortion, a representative process might require on the order of a thousand iterations. If no, the process loops back to step 580, in which the time increment is advanced, and then continues back to step 560. If yes, the process continues to step 590.

In step 590, the equalizer computes and outputs to a decoder soft extrinsic information comprising a difference of a posteriori log-likelihood ratio (LLR) information for the one or more coded bits and the a priori LLR information. A symbol branch corresponds to one symbol in the case of MLSE and a symbol branch corresponds to more than one symbol in the case of RSSE. Block 590 then transfers control to block 595.

In step 595, the decoder computes and feeds back to the equalizer the a priori LLR information for the one or more coded bits. Block 595 then transfers control to block 598.

In step 598, the decoder computes the a posteriori LLR information and outputs it to a bit sink.

Block 598 then terminates the process.

One of the insights behind embodiments of the current invention is that performing equalization via trellis computation does not require highly accurate modeling of the non-linear behavior of the amplifier. Embodiments of the invention dramatically reduce the number of needed non-linear channel modeling coefficients, while still achieve excellent BER performance.

Advantages of embodiments of the invention include limiting the number of states to a constant number, which avoids exponential growth and makes computation incomparably more tractable than it was prior to embodiments of this invention. Embodiments of the invention allow demodulation to occur with lower complexity relative to the prior art. Embodiments of the invention allow demodulation to occur with linear complexity rather than the prior art, which could only achieve exponential complexity.

Embodiments of the invention provide a very effective reduced state trellis SISO equalizer that achieves near optimal performance with very manageable computational complexity. Embodiments of the invention keep the number of states small so that the system is incrementable with good performance. The discarding of unused symbols in a rolling pruning process reduces the demands on one or more of equalizer memory and equalizer data storage.

While the above representative embodiments have been described with certain components in exemplary configurations, it will be understood by one of ordinary skill in the art that other representative embodiments can be implemented using different configurations and/or different components. For example, it will be understood by one of ordinary skill in the art that the order of certain fabrication steps and certain components can be altered without substantially impairing the functioning of the invention.

For example, the time interval between successive trellis iterations could be variable rather than constant. For example, one or more of the equalizer memory, the alpha data memory section, the beta data memory section, the sigma data memory section, the equalizer memory, the alpha data memory section, the beta data memory section, and the sigma data memory section may instead be located outside the equalizer, as a free-standing device or as part of another component of the system.

For example, instead of separately computing the branch metric of each time interval, the branch metrics may be computed in advance for multiple time increments and then saved in one or more of equalizer memory and equalizer data storage. Such computation on the fly has the advantage of saving on computational memory.

The representative embodiments and disclosed subject matter, which have been described in detail herein, have been presented by way of example and illustration and not by way of limitation. It will be understood by those skilled in the art that various changes may be made in the form and details of the described embodiments resulting in equivalent embodiments that remain within the scope of the appended claims.

I claim:

1. A method for trellis-based sequence estimation in a satellite communication signal using the algorithm by Bahl, Cocke, Jelinek, and Raviv (BCJR), comprising:
   generating a trellis using a computer;
   using the computer, generating one or more predicted symbols using a first non-linear model;
   using the computer, computing and saving two or more branch metrics using a priori log-likelihood ratio (LLR) information, a channel observation, and one or more of the one or more predicted symbols;
   if alpha forward recursion has not yet completed, using the computer, generating two or more alpha forward recursion state metrics using a second non-linear model;
   if alpha forward recursion has not yet completed, using the computer, generating two or more alpha forward recursion state metrics for the current time increment by, using a second non-linear model, applying an add compare select (ACS) algorithm to the two or more branch metrics for the current time increment and to two or more alpha forward recursion state metrics for a last previous time increment;
   if beta backward recursion has not yet completed, using the computer, generating two or more beta backward recursion state metrics for the current time increment by, using a third non-linear model, applying an ACS algorithm to the two or more branch metrics for the current time increment and to two or more beta backward recursion state metrics for the last previous time increment;
   if sigma forward recursion has not yet completed, using the computer, generating two or more sigma forward recursion state metrics using the two or more branch metrics, the two or more alpha state metrics, and the two or more beta backward recursion state metrics, to estimate a sequence for the trellis;
   using the computer, generating extrinsic information comprising a difference of a posteriori LLR information and the a priori LLR information;
   using a decoder, decoding the satellite communication signal by computing and feeding back the a priori LLR information; and
   using the computer, calculating the a posteriori LLR information, thereby improving the ratio of the satellite communication signal to noise by between approximately 3 decibels (dB) and approximately 4 dB.

2. The method of claim 1, wherein the trellis is a maximum likelihood sequence estimation (MLSE) full complexity trellis.

3. The method of claim 1, wherein the trellis is a reduced state sequence estimation (RSSE) reduced complexity trellis.

4. The method of claim 3, wherein the method further comprises:
   using a set portioning symbol map, constructing constellation symbol maps so as to partition the symbol set to allow parallel symbols.

5. The method of claim 1, wherein the first non-linear model comprises a first combination of one or more of a Volterra series decomposition, a memory polynomial model, a Wiener model, a Hammerstein model, a lookup table model, and another non-linear model.

6. The method of claim 5, wherein the first combination comprises one or more of a linear combination and a non-linear combination.

7. The method of claim 6, wherein the first combination comprises a non-linear first combination.

8. The method of claim 7, wherein the non-linear first combination comprises a Taylor series expansion.

9. The method of claim 1, wherein the second non-linear model comprises a second combination of one or more of a Volterra series decomposition, a memory polynomial model, a Wiener model, a Hammerstein model, a lookup table model, and another non-linear model.

10. The method of claim 1, wherein the third non-linear model comprises a third combination of one or more of a Volterra series decomposition, a memory polynomial model, a Wiener model, a Hammerstein model, a lookup table model, and another non-linear model.

11. The method of claim 1, wherein one or more of the first non-linear model, the second non-linear model, the third non-linear model, and the fourth non-linear model comprises a Volterra series decomposition using the Volterra equation.

12. The method of claim 1, wherein one or more of the first non-linear model, the second non-linear model, and the third non-linear model comprises a linear combination of a Volterra series decomposition using the Volterra equation and a lookup table.

13. The method of claim 1, wherein the step of computing further comprises:
   computing in advance and saving two or more branch metrics for one or more future time increments.

14. The method of claim 1, wherein the trellis comprises one or more of a list of outgoing states for one or more current state, a list of incoming states for one or more of the current states, a list of symbols associated with the outgoing states, and a list of symbols associated with the incoming states.

15. The method of claim 1, further comprising an additional step, performed before the step of generating the trellis, comprising:
   initializing by setting an initial value to zero if no branch metrics were calculated for the last previous time increment.

16. A method for trellis-based sequence estimation in a satellite communication signal using the algorithm by Bahl, Cocke, Jelinek, and Raviv (BCJR), comprising:
   generating a trellis using an equalizer configured to estimate output of an amplifier, and using a computer;
   using the computer, generating one or more predicted symbols using a first non-linear model;
   using the computer, computing and saving two or more branch metrics using a priori log-likelihood ratio (LLR) information, a channel observation, and one or more of the one or more predicted symbols;
   if alpha forward recursion has not yet completed, using the computer, generating two or more alpha forward recursion state metrics using a second non-linear model;
   if alpha forward recursion has not yet completed, using the computer, generating two or more alpha forward recursion state metrics using a second non-linear model;
   if beta backward recursion has not yet completed, using the computer, generating two or more beta backward recursion state metrics using a third non-linear model;
   if sigma forward recursion has not yet completed, using the computer, generating two or more sigma forward recursion state metrics using the two or more branch metrics, the two or more alpha state metrics, and the two or more beta backward recursion state metrics, to estimate a sequence for the trellis;
   using the computer, generating extrinsic information comprising a difference of a posteriori LLR information and the a priori LLR information;
   using a decoder, decoding the satellite communication signal by computing and feeding back the a priori LLR information; and
   using the computer, calculating the a posteriori LLR information, thereby improving the ratio of the satellite communication signal to noise by between approximately 3 decibels (dB) and approximately 4 dB.

17. The method of claim 16, wherein the step of generating the trellis comprises using a soft-input soft-output (SISO) equalizer.

18. The method of claim 17, wherein the step of generating the trellis comprises using bandwidth efficient modulation (BEM).

19. The method of claim 16, wherein the trellis comprises one or more of a list of outgoing states for one or more current state, a list of incoming states for one or more of the current states, a list of symbols associated with the outgoing states, and a list of symbols associated with the incoming states.

20. The method of claim 16, further comprising an additional step, performed before the step of generating the trellis, comprising:
   initializing by setting an initial value to zero if no branch metrics were calculated for the last previous time increment.

* * * * *